(12) United States Patent
Zaka et al.

(10) Patent No.: US 10,121,846 B1
(45) Date of Patent: Nov. 6, 2018

(54) RESISTOR STRUCTURE WITH HIGH RESISTANCE BASED ON VERY THIN SEMICONDUCTOR LAYER

(71) Applicant: GLOBALFOUNDRIES Inc., Grand Cayman (KY)

(72) Inventors: Alban Zaka, Dresden (DE); Ignasi Cortes Mayol, Dresden (DE); Tom Herrmann, Dresden (DE); El Mehdi Bazizi, Dresden (DE); John Morgan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/620,923

(22) Filed: Jun. 13, 2017

(51) Int. Cl.
*H01L 49/02* (2006.01)
*H01L 27/06* (2006.01)

(52) U.S. Cl.
CPC .......... *H01L 28/20* (2013.01); *H01L 27/0629* (2013.01)

(58) Field of Classification Search
None
See application file for complete search history.

(56) References Cited

U.S. PATENT DOCUMENTS

2011/0169089 A1* 7/2011 Doris ............... H01L 21/84
257/350

FOREIGN PATENT DOCUMENTS

WO 2013/173150 A1 11/2013

OTHER PUBLICATIONS

Nikolaides et al., "Characterization of a silicon-on-insulator based thin film resistor in electrolyte solutions for sensor applications," Journal of Applied Physics, 95:3811-15, Apr. 2004.

* cited by examiner

*Primary Examiner* — Whitney T Moore
(74) *Attorney, Agent, or Firm* — Amerson Law Firm, PLLC (57) ABSTRACT

The present disclosure provides resistor structures in sophisticated integrated circuits on the basis of an SOI architecture, wherein a very thin semiconductor layer, typically used for forming fully depleted SOI transistors, may be used as a resistor body. In this manner, significantly higher sheet resistance values may be achieved, thereby providing the potential for implementing high ohmic resistors into sophisticated integrated circuits.

19 Claims, 3 Drawing Sheets

RESISTOR STRUCTURE WITH HIGH RESISTANCE BASED ON VERY THIN SEMICONDUCTOR LAYER

BACKGROUND

1. Field of the Disclosure

Generally, the present disclosure relates to semiconductor devices and manufacturing techniques in which passive resistive structures may be provided in complex integrated circuits requiring resistors with high resistance values so as to comply with the overall circuit design.

2. Description of the Related Art

Significant progress has been made in the field of semiconductor devices including active circuit elements, such as transistors in the form of many types of field effect transistors, bipolar transistors and the like. Depending on the overall complexity of a circuit configuration of interest, these active circuit elements may be formed on the basis of critical dimensions as small as 30 nm and even less in sophisticated planar transistor architectures, while, in other cases, similar critical dimensions may be applied in the form of three-dimensional transistor configurations. In this manner, small signal capabilities of modern integrated circuits may be significantly enhanced, while, at the same time, the reduced overall dimensions may contribute to superior speed of critical signal paths and may also result in reduced overall power consumption. On the other hand, if the handling of significant voltages and/or currents is required in respective integrated circuits, the transistor elements may be provided in the form of power devices, enabling control of currents up to several amperes or even higher and voltages of up to several hundred volts in sophisticated high voltage devices. Furthermore, there is an increasing demand for integrated circuits combining small signal capabilities with power circuitry so as to further reduce the overall size of more or less complex electronic devices, thereby forming entire systems on a single chip. Consequently, a wide variety of device architectures and manufacturing techniques are available for forming active circuit elements in accordance with the overall circuit requirements.

On the other hand, in addition to the active circuit elements in the form of transistors, which may typically represent the major part of complex integrated circuits, passive circuit elements are required, particularly when implementing more and more functions into a single integrated circuit. One important passive electronic component is a resistive structure, which may be required in many types of analog and digital circuits. Frequently, a resistive structure or resistor may be provided on the basis of semiconductor material, such as polysilicon, thereby achieving a basic resistance that is comparable with the resistance of the semiconductor material as used for the transistor elements. That is, semiconductor regions may be specifically provided in resistive structures without forming any PN junctions in order to obtain a substantially ohmic behavior of the resistive structure. The electronic characteristics of the base semiconductor material may be adjusted so as to comply with the overall requirements of the resistive structure under consideration, however, while still attempting to maintain a high degree of compatibility with the overall process flow for forming the transistor elements.

In this context, it is to be noted that basically a wide variety of electronic characteristics may, in principle, be adjusted by appropriately manipulating the semiconductor base material, which, however, may require significant additional process steps, such as performing lithography processes, implantation processes and the like, which may or may not significantly affect other process sequences that are required for forming the transistor elements. For these reasons and in view economic constraints, the process of forming passive circuit elements, such as resistive structures, has to be designed so as to be well tuned with respect to the overall process flow for forming the transistor elements, thereby, however, imposing significant constraints on the overall design and, thus, electronic characteristics of the passive circuit elements.

Therefore, resistive structures may be provided in various device levels, depending on the required electronic characteristics. For instance, in bulk architectures, resistive structures may be formed on the basis of semiconductor regions having similar electronic characteristics, such as dopant concentration and the like, compared to the semiconductor regions as used in transistor elements, wherein, however, size and configuration of respective semiconductor regions may be specifically adapted so as to obtain a desired resistance value. In this case, the basic electronic characteristics of the semiconductor material for the resistive structures depend on the respective treatments applied to the semiconductor material, which may also be applied to the transistor elements in order to maintain a required high degree of process compatibility. In other cases, materials may be used as resistor base material which may have to be implemented for the transistor elements, such as the semiconductor material used for gate electrode structures in the form of polysilicon and the like, wherein, also in this case, basic characteristics of the semiconductor material are substantially determined by the characteristics demanded by the transistor elements. In the device level of gate electrodes, metal-containing semiconductor material, for instance in the form of silicide, may also be frequently used as resistor base material, thereby also contributing to a high degree of compatibility with the overall process flow, thereby, however, also imposing certain constraints with respect to the achievable overall resistance value. In still other cases, resistive structures may even be provided in the metallization level of complex semiconductor devices, wherein respective slight modifications may be implemented so as to typically obtain an increased resistance value of respective metal lines and via structures that form the resistive structure under consideration. Depending on the overall complexity of the circuit design under consideration, two or more of the above concepts may even be combined within a single integrated circuit so as to obtain different types of resistive structures in order to cover the various aspects of a certain circuit design.

As already discussed above, the device level used for forming the resistive structure in combination with the overall dimensions thereof may, thus, substantially determine the resistance value that is obtainable by a corresponding resistive structure. For example, in well-established concepts for implementing a resistive structure, the sheet resistance that may be achieved varies in a wide range, for instance, beginning at approximately 150±20% Ω/square for highly doped N-type semiconductor regions, while a highly doped P-type semiconductor region may have a sheet resistance of approximately 200 Ω/square. For highly N-doped polysilicon material, typically a sheet resistance of approximately 500-700 Ω/square may be achieved, while, on the other hand, a silicided polysilicon material of high dopant concentration may have a relatively low sheet resistance of approximately 30 Ω/square. Consequently, in or immediately adjacent to the semiconductor level of a typical silicon-based semiconductor device, the sheet resistance may vary from approximately 30 Ω/square to approximately 700 Ω/square so that a respective resistance value of a resistive structure may then be obtained by appropriately selecting the size and shape of the resistive structure. Although these concepts may provide moderate design flexibility in implementing resistive structures into complex semiconductor device designs, it turns out that, in an increasing number of applications, relatively high resistance values in the MΩ to GΩ range may be required. On the basis of the sheet resistance values specified above, a significant number of "squares" would be required, for instance, for implementing a GΩ resistor. For example, $10^6$ squares may be necessary for obtaining an appropriate resistance value in the GΩ range, which may, therefore, result in significant consumption of device area. In other cases, a minimum lateral size may have to be used in combination with a very long "length" in the current flow direction, in order to achieve a desired high resistance value, which may, however, also contribute to significant area consumption, thereby rendering these approaches less attractive and efficient. Consequently, when implementing resistive structures requiring high resistance values, the resulting integration density may be significantly reduced, which may directly translate into more costly integrated circuits or which may cause changes of the overall circuit design, since such high resistance values may frequently have to be provided outside of an integrated circuit.

In view of the situation described above, the present disclosure, therefore, relates to semiconductor devices and techniques in which resistive structures may be provided with moderately high resistance values, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that a frequently used platform for forming sophisticated silicon or semiconductor-on-insulator (SOI) devices may be taken advantage of by using the typically very thin semiconductor layer as a basic sheet material for forming resistive structures. In this respect, a very thin semiconductor layer is to be understood as a semiconductor layer having a thickness of approximately 15 nm and less, which is typically used in sophisticated SOI architectures for forming fully depleted transistor elements. The significantly reduced thickness of the basic semiconductor layer compared to conventional concepts, as, for instance, discussed above, may, therefore, result in a significantly increased sheet resistance, wherein the typically relatively low dopant concentration in these relatively thin semiconductor layers may additionally contribute to a desired high sheet resistance value. By appropriately implementing the very thin semiconductor layer of an SOI architecture into a resistive structure, relatively high resistance values may be achieved, while the occupied area is significantly less compared to conventional approaches. In this manner, the implementation of relatively high-ohmic resistors may be accomplished without undue adaptation of the overall process flow and, in particular, without requiring undue additional substrate area.

Moreover, the concepts disclosed herein may additionally provide a control mechanism so as to adjust the final resistance value of a resistive structure, thereby additionally contributing to increased overall design and operational flexibility of semiconductor devices, including the resistive structures formed in accordance with the techniques of the present disclosure. For example, controllability of the final resistance value may be accomplished on the basis of an "electrode" structure for applying a respective voltage across the semiconductor base layer of the resistive structure, which may, therefore, sufficiently modify the overall conductivity of the semiconductor base layer so as to provide the possibility of adjusting the electronic characteristics of the resistive structure under consideration. In some illustrative embodiments, the resistance value may be dynamically or statically adjusted, depending on the overall requirements of the circuit design under consideration. For instance, at a final stage of the overall manufacturing process, a plurality of "control" voltages may be available so as to be connected to one or more resistive structures or portions thereof in order to appropriately adjust the resistance value and/or to finely tune the resistance value, for instance, for compensating for manufacturing related tolerances of resistance values, by selecting an appropriate resistor control voltage. The finally selected resistor control voltage may then be connected in a permanent manner, for instance, by "blowing" respective fuses and the like, thereby achieving a static adjustment of the final resistance value. In other cases, appropriate circuitry may be provided so as to enable a dynamic adaptation of a corresponding resistor control voltage, thereby imparting readjustment capabilities to the resistive structure on the basis of external input and/or an internal control mechanism.

One illustrative embodiment disclosed herein relates to an on-chip resistor structure that comprises a resistor body. The resistor body is partially formed of a semiconductor layer having a thickness of approximately 15 nm or less, wherein the semiconductor layer is formed on a buried insulating layer. The on-chip resistor structure further includes a first contact region and a second contact region positioned adjacent to and in electrical contact with the resistor body, wherein the first and second contact regions are at least partially formed of a semiconductor material. Furthermore, the resistor body is laterally interposed between the first and second contact regions.

In a further illustrative embodiment disclosed herein, a semiconductor device includes a fully depleted field effect transistor formed in and on a first portion of a semiconductor layer that is formed on a buried insulating layer. Moreover, the semiconductor device includes a resistor structure that comprises a resistor body formed of a second portion of the semiconductor layer.

In still another illustrative embodiment disclosed herein, a method is provided. The method includes delineating a resistor region of a semiconductor layer formed on a buried insulating layer by forming an isolation structure in the semiconductor layer, wherein the semiconductor layer has a thickness of 15 nm or less. The method further includes forming a first contact region so as to electrically connect to a first end portion of the resistor region. Additionally, the method includes forming a first contact region so as to electrically connect to a second end portion of the resistor region, wherein the second end portion is positioned opposite to the first end portion.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is generally based on the concept that resistor structures in sophisticated semiconductor devices may be formed on the basis of a thin semiconductor material as is also typically used for forming sophisticated fully depleted transistor elements in an SOI configuration, wherein basically the degree of dopant concentration within the semiconductor layer is moderately low in order to comply with the requirements of fully depleted SOI transistor elements. By restricting the effective resistor body that substantially determines the overall resistance value of the resistor structure under consideration to the thin semiconductor layer, a significantly higher sheet resistance may be obtained, which, therefore, contributes to a significantly reduced area consumption of high ohmic resistor structures compared to the conventional strategies, as described above.

For instance, in some illustrative embodiments, the dopant concentration of the semiconductor layer used for active regions of fully depleted SOI transistor elements may be less than $5 \times 10^{18}$ cm$^{-3}$ or even less than $5 \times 10^{17}$ cm$^{-3}$, such as approximately $1 \times 10^{17}$ cm$^{-3}$ and less, which translates into a sheet resistance of approximately $10^4$ Ω/square to $10^5$ Ω/square, such as approximately $3 \times 10^5$ Ω/square and higher. It should be appreciated that the term "approximately" used herein encompasses respective uncertainties that are typically associated with a respective parameter. For instance, the term "approximately" in the context of a dopant concentration may be understood as including a range for a given value of ±10% of the specified dopant concentration, wherein such variations may also depend on the specific process technique used for introducing a specific dopant species into a base semiconductor material. When forming semiconductor devices, ion implantation techniques may be frequently used for positioning a specific dopant species at or around a specific depth, wherein process-related variations and, in particular, penetration of the dopant species into the semiconductor material and the advance of the dopant species within the material may result in unavoidable variations of a specific dopant concentration at a specific location in the semiconductor material. Furthermore, respective dopant profiles may be modified during the further processing, for instance, by processes involving increased temperatures, which may also affect the diffusion behavior of the respective dopant species. In other cases, a dopant species may be incorporated into the deposition atmosphere of sophisticated deposition techniques, for instance, for forming the semiconductor layer or at least a portion thereof by epitaxial growth techniques, during which the respective dopant species may be incorporated into the lattice structure of the semiconductor base material upon depositing the material on an underlying seed layer. In this manner, a desired dopant concentration may be provided across a desired layer thickness of a semiconductor material with superior accuracy compared to the generation of a dopant profile on the basis of ion implantation techniques.

Moreover, it should be appreciated that the "unit" Ω/square is to be understood as the unit typically used in this field of technique in order to express the resistance of a relatively thin layer of material in which the current flow direction is substantially perpendicular to the respective layer surfaces. That is, the sheet resistance may be considered as a measure of resistance that may be directly measured using a four-terminal probe measurement system or which may be indirectly measured by using a non-contact measurement system, for instance, based on eddy currents. The sheet resistance of a thin material layer, for instance, a thin semiconductor, a thin metal material and the like, is invariable with respect to the layer contact and may, therefore, be efficiently used for comparing electrical characteristics of layers that are different in size.

In addition to the concept of utilizing a very thin semiconductor layer as the base material for a resistor body for high ohmic resistor structures, the present disclosure also takes into consideration the concept of employing a control mechanism for such resistor structures in order to appropriately adjust the desired final resistance value. To this end, it has been recognized that the resistance value of high ohmic resistor structures based on a very thin semiconductor layer, as is also usable for fully depleted SOI transistors, may be efficiently controlled, for instance, by applying an appropriate voltage at the substrate material positioned below the buried insulating layer of the SOI architecture. In this manner, for given device-specific conditions, such as dopant concentration of the base semiconductor material, size and shape of a resistor structure and the like, a certain degree of adjustability may be obtained, thereby providing a pronounced degree of flexibility in adjusting the overall electronic characteristics of a specific semiconductor device without having to implement significant modifications in device design or overall process flow. In other cases, the variation of individual semiconductor devices provided on a single substrate or provided across a plurality of different substrates may be significantly reduced, for instance, at a final phase of the overall manufacturing process upon characterizing the finally obtained electronic properties of a specific type of semiconductor device, in that a corresponding resistor "control" voltage may be adjusted so as to minimize, or at least reduce, the process variations encountered during the previous complex manufacturing flow.

Figure 1:
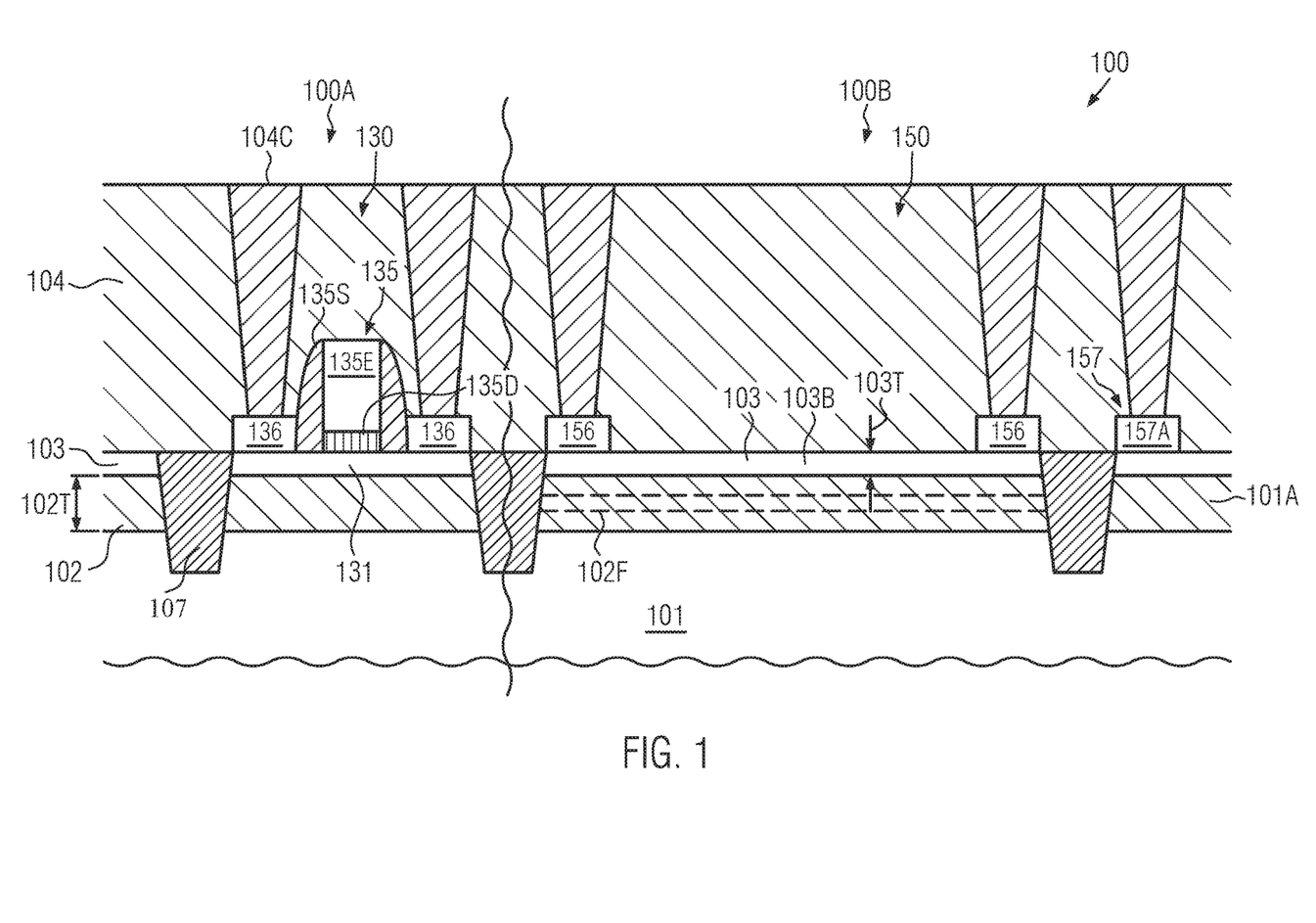
FIG. 1 schematically illustrates a cross-sectional view of a semiconductor device including a fully depleted transistor element in an SOI architecture and a resistor structure formed on the basis of the thin semiconductor layer of the SOI configuration, according to one illustrative embodiment.
Figure 2:
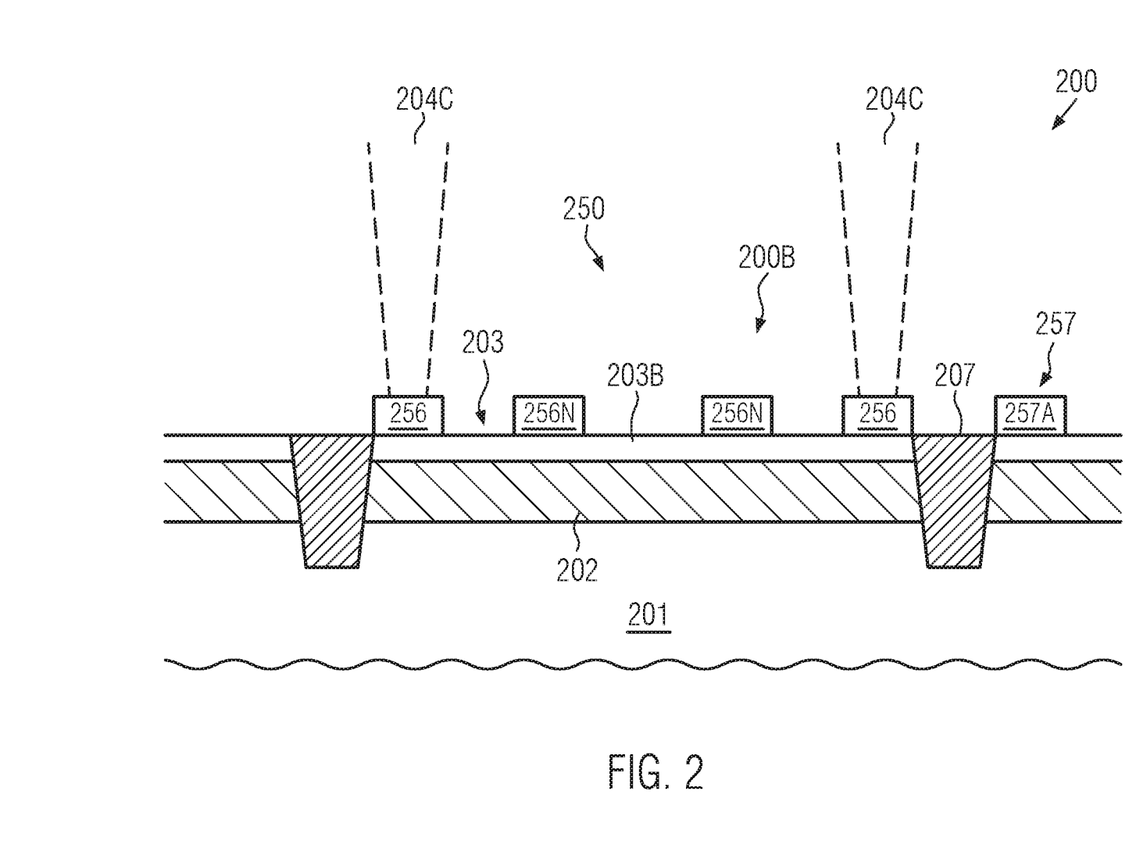
FIG. 2 schematically illustrates a cross-sectional view of a resistor structure according to further illustrative embodiments, in which additional semiconductor regions may be formed in and/or on the semiconductor layer of the resistor structure so as to appropriately modify the final resistance value and/or enhanced heat dissipation capabilities.
Figure 3:
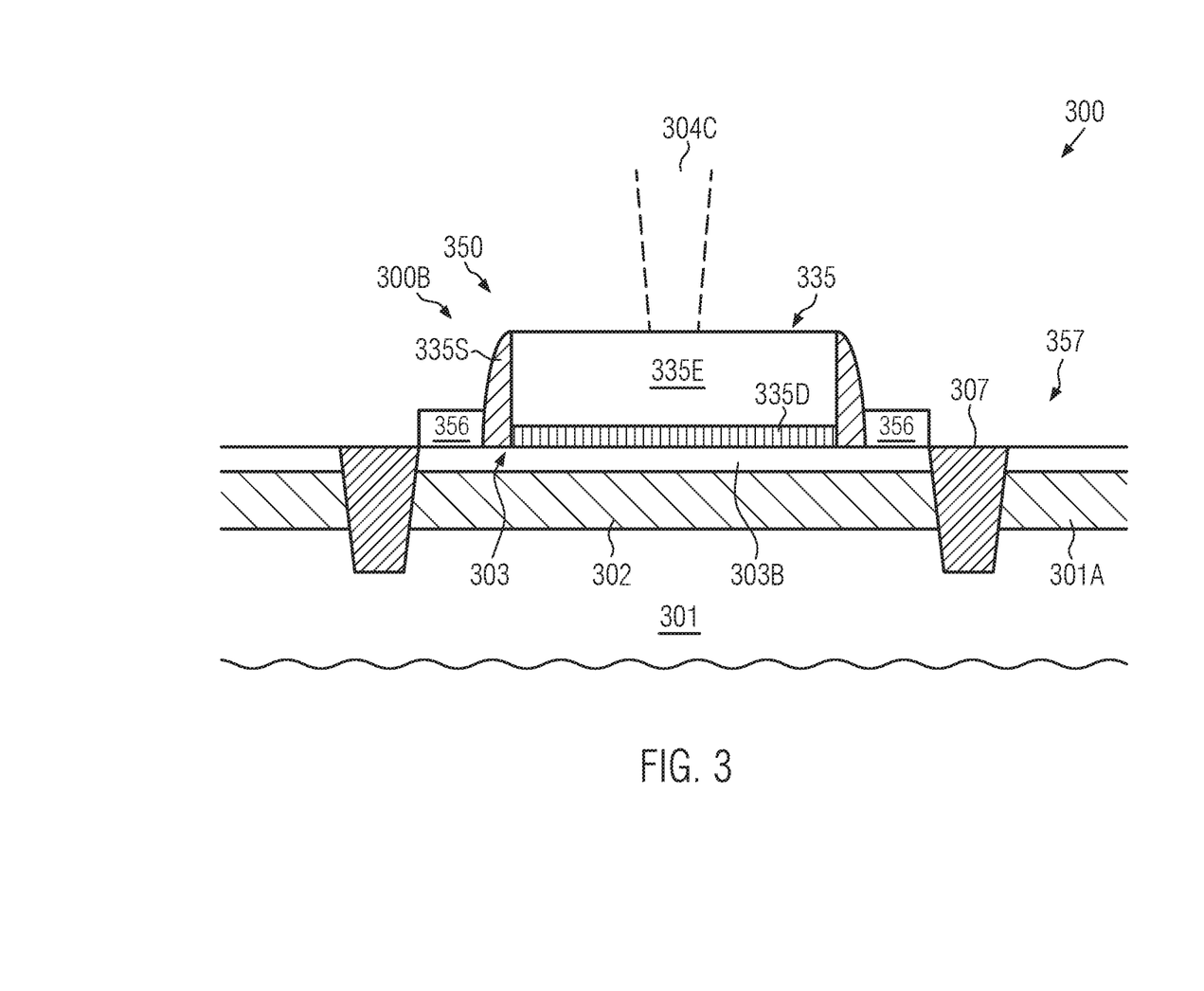
FIG. 3 schematically illustrates a cross-sectional view of further illustrative embodiments, in which an additional resistor control electrode may be provided so as to tune the resistance value.

With reference to FIGS. 1-3, further illustrative embodiments of the present disclosure will now be described in more detail.

FIG. 1 schematically illustrates a cross-sectional view of a semiconductor device 100 formed in accordance with at least one of the concepts discussed above. The semiconductor device 100 may comprise a substrate 101, which may represent any appropriate carrier material for forming thereon sophisticated semiconductor devices, including transistor elements and, in particular, resistor structures. For example, silicon is a frequently used semiconductor material which may also be used as a substantially crystalline semiconductor material for the substrate 101. In other cases, the substrate 101 may represent a substantially insulating carrier material, such as glass and the like, depending on the overall device requirements. It should be further appreciated that the substrate material 101 may further include or may be composed of other semiconductor materials, such as silicon/germanium, germanium, silicon/carbon, or any other III/V or II/VI semiconductor compounds. In one illustrative embodiment, at least an upper portion of the substrate 101 may comprise a crystalline semiconductor-based material, such as a silicon material. In other cases, when the substrate 101 may be basically composed of, for instance, a dielectric material, a respective layer of substantially crystalline semiconductor material may be provided thereon so as to provide the possibility of applying a specified voltage to at least some portions of the substrate 101, as will be discussed later on in more detail.

The semiconductor device 100 may further comprise an insulating layer 102, which may also be referred to as a buried insulating layer, as is typically the case in SOI architectures, wherein the insulating layer 102 may be "sandwiched" by respective semiconductor material layers. The buried insulating layer 102 may be formed of any appropriate dielectric material, such as silicon dioxide, silicon nitride, silicon oxynitride and the like. The buried insulating layer 102 may have any appropriate thickness 102T that is appropriate for the overall configuration of the semiconductor device 100. For example, in sophisticated applications, the thickness 102T for a silicon dioxide-based dielectric material may range from approximately 10-80 nm and more.

In some illustrative embodiments, as will also be discussed later on in more detail, the buried insulating layer 102 may comprise or may be formed of a high-k dielectric material, if considered appropriate for the operation of the semiconductor device 100. For example, in some illustrative embodiments, the buried insulating layer 102 may include or may be formed of a ferroelectric material having a specific crystallographic configuration, so as to allow generation of a polarization state that is substantially perpendicular to the lateral extension of the buried insulating layer 102. For instance, high-k dielectric materials are frequently used in the context of forming sophisticated gate electrode structures of field effect transistors so as to increase the capacitive coupling of the gate electrode to the underlying channel region of the transistor while, nevertheless, providing a sufficient physical thickness of the gate dielectric material, thereby potentially reducing any adverse static and dynamic gate leakage currents into and through the gate dielectric material. To this end, hafnium oxide-based dielectric materials are frequently used for implementing high-k dielectric material layers in gate electrode structures, wherein this material also exhibits ferroelectric characteristics, which may be taken advantage of in providing an additional mechanism for affecting the current flow behavior or conductivity of the underlying channel region. In order to appropriately exploit the ferroelectric characteristics of such a dielectric material, a corresponding configuration may be implemented so as to enable a desired type of polarization of the ferroelectric material, wherein the electrical field vector is typically directed substantially perpendicular to the current flow direction in the channel region. Since establishing a respective polarization state may require a relatively high external electrical field, a corresponding relatively high voltage may be applied for creating a desired polarization state, which, however, may then be substantially stationary when removing the relatively high external electric field. Consequently, during further operation of the corresponding transistor or other electronic devices on the basis of less pronounced electric fields, the polarization state may be preserved, therefore, resulting in an efficient mechanism for affecting the electronic characteristics. On the other hand, if required, the polarization state may be reversed at any point in time, if necessary.

Similarly to transistor elements, a respective ferroelectric material formed in one or more portions of the buried insulating layer 102 may, therefore, provide the option of implementing a control mechanism for adjusting the electronic behavior of a resistor structure, as will be discussed later on in more detail. For example, in some illustrative embodiments, a ferroelectric material 102F may be formed within the buried insulating layer 102, at least within a device region 100B, in and above which a resistor structure 150 may be formed. In the embodiment shown, the ferroelectric material 102F may be formed so as to be "vertically" enclosed by respective standard dielectric materials, such as silicon dioxide, silicon nitride and the like. In other cases, the buried insulating layer 102 may be substantially completely formed of the ferroelectric material 102F, while, in other cases, the ferroelectric material 102F may be positioned at a top surface or bottom surface of the buried insulating layer 102. Moreover, in the embodiment shown in FIG. 1, the ferroelectric material 102F may be provided in a portion of the buried insulating layer 102 corresponding to the device region 100B, while, in other cases, if considered appropriate, the ferroelectric material 102F may also be formed in a portion of the buried insulating layer 102 provided in a device region 100A, which may correspond to a transistor element 130.

Furthermore, the semiconductor device 100 may comprise a semiconductor layer 103, which may be referred to as a thin semiconductor material having a thickness 103T that may be approximately 15 nm and less, such as 8 nm and less. It should be appreciated that, although the semiconductor layer 103 is illustrated so as to represent a homogeneous material having a relatively spatially constant thickness 103T, the material composition may, nevertheless, be different at different device areas of the semiconductor device 100. For instance, the semiconductor layer 103 may frequently be provided in the form of an SOI substrate formed of the substrate 101, the buried insulating layer 102 and an initial instance of the semiconductor layer 103. In some illustrative embodiments, the semiconductor layer 103 may be a crystalline silicon layer or silicon/germanium compound, wherein, if required, in other embodiments, the configuration of the semiconductor layer 103 may be modified, starting from an initial state or intermediate state, with respect to material composition and/or dopant concentration and/or layer thickness by performing respective processes, such as etching, selective epitaxial growth processes and the like, in order to adjust the characteristics of the layer 103 in view of corresponding circuit elements to be formed in and above the respective portions of the semiconductor layer 103. Irrespective of any such modifications of the initial layer 103, this layer may, nevertheless, be referred to as semiconductor layer 103, wherein, in particular, its initial thickness prior to forming complex components, such as gate electrode structures and the like, may be in the above-specified range of approximately 15 nm and less.

In the embodiments shown, the semiconductor layer 103 may be provided in the device region 100A and may be used for forming the transistor element 130, while, in the device region 100B, the semiconductor layer 103 may be used for forming the resistor structure 150 and, in particular, may be used for providing a resistor body 103B, which, in combination with the overall lateral size and shape, may basically determine the resistance value of the resistor structure 150. Consequently, the sheet resistance of the resistor structure 150 is determined by the resistor body 103B and, thus, by the semiconductor layer 103 without implementing other mechanisms, such as any polysilicon material, metal silicide and the like. The semiconductor layer 103 in the device region 100B that forms the resistor body 103B may have a dopant concentration as discussed above.

The transistor element 130 formed in the device region 100A may represent any appropriate transistor element, which, in some illustrative embodiments, may be configured as a fully depleted SOI transistor. In this context, a fully depleted SOI transistor may be understood as a transistor formed on the basis of the semiconductor layer 103, thereby providing a channel region 131 having a relatively low dopant concentration or substantially no dopant concentration at all, depending on the overall device requirements. The electronic behavior of the channel region 131 may be controlled by a gate electrode structure 135, which, as previously discussed, is to be understood as a control structure including at least one dielectric material 135D in contact with the channel region 131 and at least one electrode material 135E in contact with the dielectric material 135D, wherein the material 135E may be connected to an appropriate control voltage terminal (not shown). Furthermore, the gate electrode structure 135 may typically comprise respective sidewall spacers 135S, which may usually be provided in the form of or may include a dielectric material, depending on the overall requirements for the transistor element 130. Due to the reduced thickness of the channel region 131 and due to a very low dopant concentration, as discussed above, at least in significant portions of the channel region 131, the conductivity of the channel region 131 may be controlled on the basis of the gate electrode structure 135, wherein, in a specific operating state of the transistor element 130, a substantially depleted zone extends throughout nearly the entire channel region 131. For example, for an N-type transistor element and for a control voltage applied to the gate electrode structure 135 for controlling the transistor element 130 into the non-conductive state, a substantially complete depletion of negative charge carriers may be obtained in the channel region 131, thereby contributing to superior controllability and leakage current behavior.

Moreover, in some illustrative embodiments, the transistor element 130 may comprise raised drain and source regions 136, which may be considered as highly doped semiconductor regions formed in and above the initial semiconductor layer 103, thereby providing a highly conductive contact area for connecting to the channel region 131. For example, the raised drain and source regions 136 may have a height above the initial semiconductor layer 103 of 10 nm and significantly higher, wherein a desired type of dopant species with a desired high concentration may also be implemented therein. For instance, the dopant species provided in the raised drain and source regions 136 may be of inverse conductivity type compared to the moderately low dopant concentration in the channel region 131, thereby forming a respective PN junction (not shown).

Moreover, it should be appreciated that the raised drain and source regions 136 may also include a highly conductive metal-containing semiconductor compound, such as a semiconductor compound containing nickel and the like, such as a nickel silicide, depending on the composition of the raised drain and source regions 136.

Similarly, the resistor structure 150 formed in the device region 100B may comprise first and second contact regions 156, which, in one illustrative embodiment, may be provided in the form of raised semiconductor regions, including any appropriate material composition and dopant species so as to obtain a low ohmic contact area for the resistor structure 150. In some illustrative embodiments, the moderately high dopant concentration provided in the raised semiconductor regions 156 may be of the same conductivity type as the moderately low dopant concentration in the semiconductor layer 103 and, thus, in the resistor body 103B, thereby avoiding the formation of a PN junction.

For example, typically, complementary transistor elements may have to be formed in the semiconductor device 100 so that respective highly doped raised drain and source regions 136 may have to be provided for P-type transistors and N-type transistors. When forming any such semiconductor-based drain and source regions 136 of appropriate doping type, the contact regions 156 may also be formed so as to avoid the occurrence of a PN junction between the highly doped regions 156 and the resistor body 103B. That is, in some illustrative embodiments, the contact regions 156 may be formed during the same process for forming respective raised drain and source regions 136 having a type of doping which corresponds to the type of doping in the resistor body 103B, thereby providing for an ohmic behavior between the contact regions 156 and the resistor body 103B. That is, the resistor body 103B may have the same type of doping as the contact regions 156.

Similarly, as discussed above with reference to the raised drain and source regions 136, the contact regions 156 may also comprise a metal-containing material (not shown), such as nickel and the like, for instance, in the form of nickel silicide or any other semiconductor compound, depending on the configuration of the contact regions 156 that may be formed in the same manner as respective raised drain and source regions 136 of an appropriate transistor element, as discussed above. In this context, it should be understood that the contact regions 156 may be appropriately positioned so as to laterally determine an effective length of the resistor body 103B. That is, one of the contact regions 156 is formed at a first end of the semiconductor layer 103 and the other contact region 156 is formed at the other end of the semiconductor layer 103, wherein the space between the contact regions defines the length of the resistor body 103B. It should be appreciated that the resistor body 103B may have a folded geometry, wherein the "length," which in FIG. 1 is to be considered as the horizontal extension of the resistor body 103B, may be extend into another lateral direction, such as a direction corresponding to a "width" direction of the transistor element 130, i.e., the direction that is perpendicular to the drawing plane of FIG. 1.

When formed on the basis of the same process sequence, the raised drain and source regions 136 of a corresponding transistor element and the contact regions 156 may then have the same configuration in terms of material composition and vertical structure. On the other hand, it should be appreciated that the lateral dimensions of the contact regions 156 may differ from lateral dimensions of respective raised drain and source regions 136, in one or both lateral dimensions, i.e., the length direction corresponding to the horizontal direction in FIG. 1, and the width direction, corresponding to the direction perpendicular to the drawing plane of FIG. 1. That is, the lateral dimensions of the contact regions 156 may be adjusted independently of the respective lateral dimensions of the raised drain and source regions 136, wherein, however, the "vertical" configuration or structure, i.e., the structure along a height direction, i.e., in FIG. 1, the vertical direction, may basically be identical to a specific type of transistor element 130, as discussed above. It should be further appreciated that the finally obtained resistance value of the resistor structure 150 is basically determined by the characteristics of the resistor body 103B, while the size and shape of the contact regions 156 may not substantially affect the behavior of the resistor structure 150. Consequently, as discussed above, for a moderately low dopant concentration in the resistor body 103B, i.e., in the initial semiconductor layer 103, a moderately high resistance value at low area consumption may be accomplished. For example, a dopant concentration of approximately $1 \times 10^{17}$ cm$^{-3}$ and less may result in a sheet resistance of approximately $3 \times 10^5$ Ω/square, which may, thus, represent a typical sheet resistance value of fully depleted SOI transistors with relatively low width. On the other hand, a dopant concentration of approximately $1 \times 10^{18}$ cm$^{-3}$, as frequently used in fully depleted SOI transistors of relatively large width, may still result in a sheet resistance value of approximately $5 \times 10^5$ Ω/square. As a consequence, the resulting sheet resistance of the resistor body 103B may be significantly higher compared to the highest sheet resistance values obtained in well-established resistor concepts, in which less than 1000 Ω/square may be typically achievable, as discussed above.

In other illustrative embodiments, the semiconductor layer 103 of the resistor structure 150, that is, the resistor body 103B, may have a net dopant concentration of less than $5 \times 10^{18}$ cm$^{-3}$, while, in still other illustrative embodiments, the net dopant concentration of the resistor body 103B may be less than $5 \times 10^{17}$ cm$^{-3}$. In this respect, it should be understood that the net dopant concentration may indicate the difference of dopant concentration when dopant species of two different conductivity types may be present in the same material volume under consideration.

In some illustrative embodiments, the resistor structure 150 may comprise a control mechanism 157, also referred to as "back electrode structure," which may be appropriately configured so as to influence the conductivity of at least a portion of the resistor body 103B. In the embodiment shown, the back electrode structure 157 may comprise a conductive material 101A that connects to a portion of the substrate material 101, thereby forming a conductive path to the area located below the buried insulating layer 102 in the device region 100B. The conductive material 101A may be formed in some illustrative embodiments as doped semiconductor material, such as silicon and the like, while, in other cases, other appropriate material, such as metal silicide and the like, may be provided in at least a portion of the conductive material 101A. Moreover, in some embodiments, a contact region 157A of the back electrode structure 157 may be provided and may have a similar configuration as the contact regions 156, while, in other cases, the conductive material 101A may act as an appropriate contact region, depending on composition and configuration of the material 101A. Consequently, upon applying an appropriate voltage to the back electrode structure 157, the current flow behavior and, thus, the conductivity of at least the resistor body 103B may be efficiently modified.

As an example, for a voltage applied to the back electrode structure 157 in the range of approximately 3 V, a variation of the sheet resistance in the order of approximately $1 \times 10^3$ to $1 \times 10^4$ Ω/square may be achieved, thereby providing an efficient mechanism for obtaining different resistance values on the basis of substantially the same design of a plurality of resistor structures 150. For example, one type of resistor structure 150 may be implemented on the basis of substantially no voltage supplied to the back electrode structure 157, while another type of resistor structure 150 may be operated on the basis of approximately 3 V, thereby obtaining significantly different resistance values, while basically the same layout or device design may be used for both types of resistor structures 150. Depending on the availability of different control voltages within the semiconductor device 100, an even finer "granularity" of the available resistance values based on the same device design may be obtained by appropriately connecting the respective resistor structures 150 to a specific control voltage. Moreover, if two or more respective different control voltages are available in the semiconductor device 100, respective process-related variations of a plurality of resistor structures 150 may be compensated for, at least within a certain degree, thereby also enhancing overall performance of the semiconductor device 100. It should be appreciated that effective control voltages may be readily obtained on the basis of an appropriately designed voltage divider, including two or more of the resistor structures 150, which may be provided as high ohmic resistors, thereby maintaining overall power consumption at a very low level.

In other illustrative embodiments, as already discussed above, the back electrode structure 157 may, additionally or alternatively to providing a control voltage for influencing the conductivity of the resistor body 103B, comprise, at least in certain portions of the buried insulating layer 102, the ferroelectric material 102F, the polarization state of which may then be efficiently adjusted on the basis of an appropriate "programming" voltage. To this end, for instance, the contact regions 156 in combination with the back electrode structure 157 may be used for applying an appropriate programming voltage of, for instance, approximately 5 V, so as to establish a desired polarization state in the ferroelectric material 102F, thereby providing the potential for permanently influencing the conductivity in the resistor body 103B, even after removal of the programming voltage and even without applying an additional control voltage. It should be appreciated that the ferroelectric material 102F may not be provided continuously across the device region 100B, but may be implemented only at certain areas so as to specifically influence only certain portions of the resistor body 103B. For example, by programming a specific polarization state and, if required, by programming the inverse polarization state, a significant variation of the resulting resistance of the resistor structure 150 may be obtained, wherein a corresponding operating state of the resistor structure 150 may even be preserved after switching off supply power of the semiconductor device 100.

It should be appreciated that a back electrode mechanism (not shown) may also be provided for the transistor element 130. To this end, the portion of the substrate 101 positioned below the transistor element 130 may have an appropriate dopant profile and concentration so as to allow it to be connected to a desired reference voltage, thereby increasing overall controllability of the transistor element 130. In some illustrative embodiments, the back electrode structure 157 and a "back electrode" structure of a respective transistor element may have the same configuration in terms of dopant profile and concentration of the relevant portions of the substrate 101.

The semiconductor device 100 may further comprise a contact structure and a metallization system (not shown), which may be configured so as to provide the required electrical connectivity for the various circuit elements of the semiconductor device 100 and to finally connect to the respective terminals that are used for communication of the semiconductor device 100 with the periphery. For convenience, instead of the complex wiring system, a contact level 104 is illustrated in FIG. 1, which may comprise any appropriate dielectric material for enclosing and passivating the circuit elements 130, 150. For instance, the contact level 104 may comprise silicon nitride in combination with silicon dioxide, which represent frequently used dielectric materials for enclosing and passivating circuit elements. It should be appreciated, however, that any appropriate composition of materials may be applied, depending on the overall device requirements. Furthermore, electrically conductive elements 104C may be formed in the contact level 104 so as to connect to the respective contact regions of the circuit elements. For instance, some of the contact elements 104C may connect to the raised drain and source regions 136, for instance, to respective metal-containing semiconductor compound materials (not shown), as discussed above. Similarly, other contact elements 104C may connect to the contact regions 156 and optionally to the contact region 157A, if provided, wherein, typically in the contact regions 156, metal semiconductor compound materials, such as nickel silicide, may be provided, as already discussed above. On the other hand, the contact region 157A may represent an upper portion, possibly a metal silicide portion, of the conductive material 101A, depending on the overall design of the semiconductor device 100.

The semiconductor device 100 as illustrated in FIG. 1 may be formed on the basis of the following processes. The substrate 101 may be provided so as to include the buried insulating layer 102 and the initial instance of the semiconductor layer 103. In other cases, the substrate 101 may be provided so as to have a top surface including the insulating layer 102 or at least a portion thereof, while a semiconductor layer, possibly in combination with an insulating material, may be transferred to the substrate 101 by wafer bond techniques, possibly followed by a further adaptation of the initial semiconductor layer 103 in terms of layer thickness and the like. It should be further appreciated that, in some illustrative embodiments, the dielectric material of the buried insulating layer 102 may be modified, at least within portions of the device region 100B, so as to include the ferroelectric material 102F. To this end, prior to applying the semiconductor layer 103, for instance on the basis of wafer bond techniques and the like, a portion of the insulating material of the layer 102 may be removed and may be replaced by the ferroelectric material 102F, followed by a further formation of dielectric material, if required.

Next, the desired material characteristics of the semiconductor layer 103 and the semiconductor material formed below the buried insulating layer 102 may be adjusted so as to comply with the various requirements for, for instance, N-type and P-type fully depleted transistor elements, such as the transistor element 130. For example, if required, locally a portion of the semiconductor material 103 may be removed and an appropriate semiconductor material may be epitaxially grown in compliance with the local device requirements. In other cases, the semiconductor material on top of the buried insulating layer 102 may be generally provided in the form of a seed material, while the finally required layer thickness, doping and the like may be accomplished during further processes, such as epitaxial growth processes and the like. It should be appreciated that, in particular, the semiconductor layer 103 in the device region 100B may substantially correspond to the semiconductor layer 103 as used in a corresponding type of transistor element 130. For instance, if a certain type of transistor element 130 may require a slightly N-doped configuration, for instance, having a dopant concentration in the above specified ranges, a corresponding configuration of the semiconductor layer 103 may also be used in the device region 100B. Similarly, if a respective net P-type doping may be applied in some device regions 100A, a corresponding configuration of the semiconductor layer 103 may be used in the region 100B, thereby avoiding any resistor-specific processes for specifically preparing the resistor bodies 103B. Similarly, the dopant profile and concentration of the portions below the regions 100A, 100B may be adapted by implantation and the like, wherein also the same process recipes may be applied for both the transistor element of appropriate type and the resistor structure 150. In this manner, in some illustrative embodiments, a high degree of compatibility of the overall process flow may be achieved with respect to the device regions 100A and the device regions 100B.

Prior to and/or after adjusting the local material configuration of the semiconductor layer 103 and/or the relevant portions of the substrate 101, isolation structures 107 may be formed, for instance, in the form of shallow trench isolation and the like, which may appropriately laterally delineate specific device areas, for instance, the transistor element 130 and the resistor structure 150. The isolation structures 107 may extend through the respective semiconductor layer 103, the buried insulating layer 102 and may extend into the substrate material 101. The isolation structures 107 may be formed on the basis of well-established process techniques, including the provision of pad and mask layers, lithography processes, etch, oxidation and deposition processes, depending on the specific requirements for the isolation structures 107.

Thereafter, gate electrode structures, such as the gate electrode structure 135, may be formed, wherein, in some illustrative embodiments, the formation of respective electrode structures may be restricted to the device regions 100A, while the regions 100B may be covered by an appropriate mask material, such as silicon dioxide and the like. In other cases, the respective materials of the gate electrode structures 135 may also be provided in the device regions 100B and may be "patterned" along with the respective gate electrode structures 135, wherein a corresponding patterning in the device regions 100B may result in a significant removal of the previously provided materials. In sophisticated applications, the formation of the gate electrode structures 135 may include the formation of sophisticated gate dielectric materials, such as the material 135D formed of standard dielectric materials, such as silicon dioxide, silicon nitride, silicon oxynitride, possibly in combination with a high-k dielectric material in order to provide superior controllability even for a gate length in the range of approximately 30 nm and significantly less. It should be appreciated that a respective complex gate dielectric material may also include appropriate species for adjusting the overall work function in order to obtain the required electronic behavior of the channel region 131. Moreover, during the formation of the gate electrode structure 135, the electrode material 135E may also be formed, for instance, on the basis of one or more metal-containing electrode materials, doped semiconductor materials and the like. It should be appreciated that, in a further advanced phase of the overall process flow, a highly conductive metal semiconductor compound may also be formed in a portion of the electrode material 135E, if required. In other cases, the material 135E may be substantially formed on the basis of a metal. Moreover, during the formation of the gate electrode structure 135, sidewall spacer structures 135S may be formed by well-established deposition and etch techniques.

Thereafter, exposed areas of the semiconductor layer 103 in the device region 100A and in the device region 100B may be partially removed so as to form an epitaxially grown highly doped semiconductor material, in accordance with overall device requirements. In other cases, a corresponding highly doped semiconductor material may be directly formed on the exposed portions of the semiconductor layer 103, if considered appropriate. It should be appreciated that, in the device regions 100B, respective areas for the contact regions 156 may be exposed by forming a corresponding mask layer, such as a silicon dioxide mask layer (not shown), a silicon nitride mask layer (not shown) and the like, wherein respective areas may be exposed. In other cases, the corresponding "gate electrode patterning process" in the device regions 100B may be performed on the basis of a "gate mask" that may result in substantially no gate electrode structure being formed in the device region 100B, while any remaining layer, such as a dielectric material of the gate dielectric layer 135D, may be protected in the device region 100B by an appropriate etch mask during a further process for opening the drain and source areas of the transistor element 130 and the area of the contact regions 156 in the resistor structure 150, thereby defining the area of the resistor body 103B. In this manner, the semiconductor layer 103 in the device region 100B and the semiconductor layer 103 corresponding to the drain and source regions 136 may experience substantially the same processes, thereby providing a high degree of compatibility of the respective resulting structures. That is, when forming the raised drain and source regions 136 for a specific type of transistor element 130, the contact regions 156 may also be formed on the basis of substantially the same conditions and using the same process steps. For instance, if the resistor structure 150 may require a highly P-doped contact region 156, these regions may be formed in the same process sequence applied when forming highly P-doped raised drain and source regions of respective transistor elements 130. Similarly, when a highly N-doped material is required for the contact regions 156, these regions may be formed together with highly N-doped raised drain and source regions 136 of a corresponding transistor element 130.

It should be appreciated that, at any appropriate stage of the overall process flow, anneal processes may be performed so as to adjust a finally required dopant profile in the various semiconductor regions. To this end, any well-established process technique, such as laser anneal, rapid thermal anneal and the like, may be applied.

Next, a metal semiconductor compound may be formed in the various drain and source regions 136 and also in the contact regions 156, which may be accomplished by well-established processes upon depositing an appropriate metal species, such as nickel and the like, and performing one or more process steps so as to convert a specified portion of the underlying semiconductor material in a semiconductor-metal compound. Next, the contact level 104 may be formed, for instance, by depositing appropriate dielectric materials, such as silicon nitride, silicon dioxide and the like, followed by a planarization, if required, of the resulting layer, thereby obtaining a substantially planar surface typography. Thereafter, lithography and etch techniques may be applied so as to form openings in the dielectric material of the contact level 104 to be aligned to respective contact regions, such as the raised drain and source regions 136, the contact regions 156 and the gate electrode structures 135, wherein, for convenience, any such contact regions for the gate electrode structures 135 are not shown. Thereafter, the openings may be filled with any appropriate conductive material and any excess material may be removed. Thereafter, one or more metallization layers may be formed in accordance with the wiring requirements for the semiconductor device 100. To this end, well-established strategies are used for forming appropriate dielectric materials, such as low-k dielectric materials, and forming therein highly conductive metal lines and vias, as required.

FIG. 2 schematically illustrates a cross-sectional view of a semiconductor device 200 comprising a device region 200B, in which a resistor structure 250 may be formed. It should be appreciated that the semiconductor device 200 may further comprise other device regions in which other circuit elements, such as transistor elements similar to the transistor element 130 of the device 100, may be provided. For convenience, any such transistor-based circuit elements are not illustrated in FIG. 2. The device region 200B may include isolation structures 207 for delineating the actual resistance-determining area of the resistor structure 250, as also discussed above with reference to the device 100. Furthermore, at least in the device region 200B, the semiconductor device 200 may have an SOI configuration, including a substrate material 201, such as a silicon material, in combination with a buried insulating layer 202, followed by a semiconductor layer 203 having a thickness of approximately 15 nm and less, such as 8 nm and less. In some illustrative embodiments, the configuration of the device region 200B may be analogous to the configuration of the device region 100B of the device 100, as shown in FIG. 1 and described in the context with this figure. That is, the resistor structure 250 may comprise contact regions 256, which may be provided in the form of highly-doped semiconductor material, and may have a similar configuration in the height direction as respective raised drain and source regions of transistor elements, also discussed above with reference to FIG. 1. The contact regions 256 may laterally enclose a resistor body 203B, that is, the portion of the semiconductor layer 203 that is not covered by the contact regions 256. It should be appreciated that, in a later manufacturing stage, the contact regions 256 may be contacted by respective contact elements 204C so as to enable electrical connection to other circuit elements in accordance with the overall circuit requirements of the semiconductor device 200.

Moreover, in the illustrative embodiment shown, the resistor structure 250 may comprise one or more additional semiconductor regions 256N, which may have a dopant concentration that may be significantly higher than the moderately low dopant concentration of the resistor body 203B. In some illustrative embodiments, the additional semiconductor regions 256N may have substantially the same configuration in the height direction, i.e., in FIG. 2, the vertical direction, compared to the contact regions 256, and may have the same or different dimensions in the respective lateral directions compared to the contact regions 256. For example, the additional semiconductor regions 256N may be provided as stripes, islands and the like on the resistor body 203B, thereby modifying the respective local sheet resistance and, thus, the finally obtained resistance value of the resistor structure 250. For example, by providing a relatively high dopant concentration having the same conductivity type as, for instance, the contact regions 256, locally the sheet resistance may be reduced, thereby obtaining a reduced total resistance value of the resistor structure 250 compared to a configuration without providing the additional semiconductor regions 256N. For example, if providing substantially the same configuration as described with reference to the resistor structure 150 as shown in FIG. 1, the respective total resistance value thereof may be reduced to a certain degree in a highly controllable manner, i.e., by providing the additional semiconductor regions 256N in the resistor structure 250, thereby obtaining a control mechanism for adjusting a finally desired resistance value on the basis of design criteria. For example, when forming the semiconductor device 200, which may be accomplished on the basis of substantially the same process techniques as described above with reference to the device 100, the contact regions 256 and the additional semiconductor regions 256N may be formed in a common process sequence, wherein position, size and shape of the additional semiconductor regions 256N may be precisely defined on the basis of a corresponding lithography mask that may be used for exposing the respective portions of the semiconductor layer 203. Consequently, by providing respective different designs for different resistor structures 250, a plurality of different total resistance values may be obtained with relatively low process variations determined by highly reliable lithography and deposition techniques.

Furthermore, the additional semiconductor regions 256N may significantly increase the heat dissipation capabilities of the resistor structure 250, in particular of the current carrying semiconductor layer 203, thereby also contributing to superior overall performance of the resistor structure 250.

In other illustrative embodiments (not shown), one or more of the additional semiconductor regions 256N may also receive respective contact elements 204C, which may or may not be actually contacted, depending on the required total resistance value of the resistor structure 250. Providing additional contact elements 204C connecting to at least some of the additional semiconductor regions 256N may still further increase the heat dissipation capability of the resistor structure 250. Although in this case additional contact pads may be required in the metallization level of the semiconductor device 200, the resulting superior flexibility in finally adjusting a required resistance value, for instance, during final electronic test procedures, may be considered advantageous in some applications.

In some illustrative embodiments, an optional back electrode structure 257, possibly including a contact region 257A, may also be implemented and may be used for adjusting the finally desired conductivity of the resistor structure 250, as also discussed above with reference to the resistor structure 150. Furthermore, if considered appropriate, a portion of or the entire buried insulating layer 202 may be replaced by a ferroelectric material, which may also be appropriately configured and polarized in view of influencing the electronic behavior of the resistor structure 250. As discussed above, respective polarization states may be established when a sufficiently high programming voltage may be applied to a respective ferroelectric material in order to reconfigure the polarization state thereof. The polarization state and, thus, the electronic characteristics of the resistor body associated therewith may then be "permanently" maintained until a further programming process is applied.

FIG. 3 schematically illustrates a cross-sectional view of a semiconductor device 300 comprising a substrate 301, a buried insulating layer 302, followed by a semiconductor layer 303 having a thickness of approximately 15 nm and less. These components are provided at least in a device region 300B, in which a resistor structure 350 may be provided. In the embodiment shown, the resistor structure 350 may comprise a resistor region delineated in the lateral directions by an appropriate isolation structure 307, wherein the resistor region may, thus, be laterally defined by the semiconductor layer 303 in combination with respective contact regions 356 and a resistor body 303B, which may actually determine the effective sheet resistance and, thus, final resistance value of the resistor structure 350. With respect to the components 301, 302, 303, 303B, 307 and 356, the same criteria may apply as also previously discussed and described with reference to the semiconductor devices 100, 200. In particular, the doping of the resistor body 303B may be in the above-specified ranges so as to obtain a sheet resistance value of approximately $10^{-3}$ to $5 \times 10^{-5}$ $\Omega$/square. Also, the contact regions 356 may have the same conductivity type as the resistor body 303B.

Furthermore, an optional back electrode structure 357 may be provided, in which an appropriate conductive material 301A may connect to the substrate material 301 so as to influence the conductivity of the resistor body 303B, as also discussed above in the context of the semiconductor devices 100 and 200. Also, the relevant portion of the substrate 301 may have implemented therein a dopant profile and concentration in the form of well regions also used for respective transistor elements formed elsewhere above the substrate 301. Moreover, in the embodiment shown, a front electrode structure 335 may be formed at least on significant surface portions of the resistor body 303B, while, in other cases, the front electrode structure 335 may substantially cover the entire resistor body 303B, i.e., the semiconductor layer 303 except for portions thereof covered or in contact with the contact regions 356. In some illustrative embodiments, the front electrode structure 335 may have substantially the same configuration in the height direction, i.e., in FIG. 3, the vertical direction, as gate electrode structures which may be formed in other device regions that may include transistor elements, such as the transistor element 130 previously discussed in the context of FIG. 1. That is, the front electrode structure 335 may, except for its lateral dimensions, comprise a dielectric layer or layer stack 335D in combination with an electrode material 335E and a sidewall spacer structure 335S. It should be appreciated that these components may have substantially the same configuration, except for lateral dimensions thereof, as the respective components of the gate structure 135 of the transistor element 130 of FIG. 1. That is, depending on device requirements and complexity of the respective transistor elements, the dielectric material 335D may include high-k dielectric materials in combination with conventional dielectric materials, as previously discussed. Similarly, the electrode material 335E may include one or more metal-containing materials, semiconductor material, possibly in combination with any metal semiconductor compound, which may be formed in any later manufacturing stage, depending on the overall process strategy applied. Similarly, the spacer structure 335S may have similar configuration and dimensions as the spacer structure 135S as shown and discussed in the context of the gate electrode structure 135 of FIG. 1.

In some illustrative embodiments, the front electrode structure 335 may actually act as a "dummy" electrode structure, since the electrode structure 335 may represent a non-connected structure. In this case, providing the electrode 335 may result in a high degree of process compatibility substantially without requiring any additional process steps specifically dedicated to forming the resistive structure 350, since no additional process steps compared to the process sequence for forming respective transistor elements may be required. On the other hand, the dummy electrode structure 335 may provide superior heat dissipation capability and integrity of the resistor body 303B.

In other illustrative embodiments, the front electrode structure 335 may serve as a functional control electrode, for instance, by being contacted by a respective contact element 304C, thereby allowing a respective variation of the conductivity of the resistor body 303B depending on the applied control voltage. In still further illustrative embodiments, the front electrode structure 335 may have incorporated therein a ferroelectric material, for instance, within or in the vicinity of the dielectric material 335D, thereby even further enhancing overall flexibility in adjusting conductivity of the resistor body 303B. As discussed above, a respective ferroelectric material may be appropriately programmed so as to exhibit a desired polarization state, which may, for instance, provide reduced conductivity, while a correspondingly reversed polarization state may significantly increase conductivity of the resistor body 303B. Also in this case, the respective polarization state, once initiated by applying an appropriate programming voltage, may be preserved as long as standard operating voltages may not reach the magnitude of the programming voltage. At any point in time, a programming voltage of sufficient magnitude may again be applied so as to establish, for instance, an oppositely polarized state, thereby achieving a corresponding reconfiguration of the conductivity in the resistor body 303B.

In other illustrative embodiments, the back electrode structure 357 may be provided together with the front electrode structure 335, thereby even further enhancing overall flexibility in adjusting the total resistance value of the resistor structure 350. It should further be appreciated that, if considered appropriate, a ferroelectric material may also be incorporated into the buried insulating layer 302, as also discussed above in the context of the semiconductor devices 100, 200.

The semiconductor device 300 as illustrated in FIG. 3, may be formed on the basis of substantially the same process techniques as already discussed in the context of FIGS. 1 and 2, wherein, in particular, the provision of the front electrode structure 335 may result in a reduced number of additional process steps associated with the formation of the resistor structure 350.

As a result, the present disclosure provides resistor structures and manufacturing techniques in which high ohmic resistance values may be obtained with reduced area consumption by taking advantage of technology platforms typically used for forming sophisticated fully depleted SOI transistors. In this concept, the extremely thin semiconductor layer used in the SOI configuration may be used as the resistor body that basically determines the final resistance value of the resistor structure. Furthermore, the control mechanism typically applied in transistor elements for applying a body or back voltage may also be efficiently applied to the resistor structures, thereby obtaining an additional control mechanism for adjusting or tuning the finally obtained sheet resistance. In other cases, ferroelectric materials may be used for further modifying the electronic behavior of the resistor body, thereby resulting in resistor structures having a configuration for storing a respective resistor state even after switching off the supply power, while, nevertheless, providing dynamic reprogramming capabilities. In other illustrative embodiments, an appropriate adjustment of the local sheet resistance and/or tuning of the heat dissipation capabilities in the resistor structure may be achieved by incorporating additional semiconductor regions while not contributing to overall process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An on-chip resistor structure, comprising
a resistor body comprising a semiconductor layer having a thickness of approximately 15 nm or less, said semiconductor layer being formed on a buried insulating layer;
at least one semiconductor region formed on said resistor body; and
a first contact region and a second contact region positioned adjacent to and in electrical contact with said resistor body and being formed at least partially of a semiconductor material, said resistor body being laterally interposed between said first and second contact regions.

2. The on-chip resistor structure of claim 1, wherein a net dopant concentration of said at least one semiconductor region is higher than a net dopant concentration of said semiconductor layer.

3. The on-chip resistor structure of claim 1, wherein said at least one semiconductor region is one of two or more isolated semiconductor regions formed on said resistor body.

4. The on-chip resistor structure of claim 1, wherein said at least one semiconductor region is doped to have a conductivity type that is the same as a conductivity type of said semiconductor layer.

5. The on-chip resistor structure of claim 1, wherein said at least one semiconductor region is a raised semiconductor region.

6. The on-chip resistor structure of claim 1, wherein said semiconductor layer and said first and second contact regions are doped so as to have a same conductivity type.

7. The on-chip resistor structure of claim 6, wherein a net dopant concentration of said first and second contact regions is higher than a net dopant concentration of said semiconductor layer.

8. The on-chip resistor structure of claim 7, wherein said net dopant concentration of said semiconductor layer is less than $5 \times 10^{18}$ cm$^{-3}$.

9. The on-chip resistor structure of claim 7, wherein said net dopant concentration of said semiconductor layer is less than $5 \times 10^{17}$ cm$^{-3}$.

10. The on-chip resistor structure of claim 1, further comprising a back electrode structure formed below said semiconductor layer and comprising a portion of said buried insulating layer.

11. The on-chip resistor structure of claim 10, wherein said back electrode structure comprises a ferroelectric material.

12. The on-chip resistor structure of claim 10, wherein said back electrode structure comprises a semiconductor substrate material formed below said buried insulating layer.

13. The on-chip resistor structure 1, further comprising one or more front electrode structures formed on portions of said semiconductor layer.

14. The on-chip resistor structure of claim 13, wherein said one or more front electrode structures comprise a ferroelectric material.

15. A semiconductor device, comprising:
a fully depleted field effect transistor formed in and on a first portion of a semiconductor layer formed on a buried insulating layer, said fully depleted field effect transistor comprising raised drain and source regions; and
a resistor structure comprising a resistor body formed on a second portion of said semiconductor layer, said resistor structure comprising raised contact regions, wherein a configuration of said raised drain and source regions and a configuration of said contact regions are equivalent.

16. The semiconductor device of claim 15, wherein said semiconductor layer has a thickness of 15 nm or less.

17. An on-chip resistor structure, comprising
a resistor body comprising a semiconductor layer having a thickness of approximately 15 nm or less, said semiconductor layer being formed on a buried insulating layer;
a first contact region and a second contact region positioned adjacent to and in electrical contact with said resistor body and being formed at least partially of a semiconductor material, said resistor body being laterally interposed between said first and second contact regions; and
a back electrode structure formed below said semiconductor layer, said back electrode structure comprising a portion of said buried insulating layer.

18. The on-chip resistor structure of claim 17, wherein said back electrode structure comprises a semiconductor substrate material formed below said buried insulating layer.

19. The on-chip resistor structure of claim 17, wherein said back electrode structure comprises a ferroelectric material.

* * * * *